June 14, 1966 K. W. ANGEL 3,256,496

CIRCUIT FOR SUBSTANTIALLY ELIMINATING OSCILLATOR FREQUENCY VARIATIONS WITH SUPPLY VOLTAGE CHANGES

Filed Jan. 9, 1963

INVENTOR.
KARL W. ANGEL

BY

George T. Craig
ATTORNEY

United States Patent Office 3,256,496

Patented June 14, 1966

3,256,496

CIRCUIT FOR SUBSTANTIALLY ELIMINATING OSCILLATOR FREQUENCY VARIATIONS WITH SUPPLY VOLTAGE CHANGES

Karl W. Angel, Princeton, N.J., assignor to Radio Corporation of America, a corporation of Delaware Filed Jan. 9, 1963, Ser. No. 250,267

1 Claim. (Cl. 331—116)

The present invention relates to transistor oscillators of the type controlled by a resonant circuit having inductance and capacity, and more particulraly to a novel transistor resonant circuit controlled oscillator in which frequency variations that normally result from supply voltage changes are so reduced as to be negligible.

An object of the present invention is to provide a novel transistor oscillator in which undesired variations in operating frequency with supply voltage changes are compensated.

Another object of the present invention is to provide a novel transistor oscillator of the Colpitts type having resistance in shunt with the frequency determining resonant circuit for reducing frequency variations due to supply voltage changes.

A further object of the present invention is to provide a novel oscillator of the modified Colpitts type effectively having resistance in shunt with the freqeuncy determining resonant circuit.

A still further object of the present invention is to provide a novel semi-conductor device oscillator of the modified Colpitts type effectively having resistance in shunt with the frequency determining resonant circuit composed of a crystal in series with a tuning capacitor.

The present invention is preferably applicable to a Colpitts type transistor oscillator having a frequency determining resonant circuit including two capacitors in series, the later providing a tap for a feedback connection to the base-to-emitter circuit from the base-to-collector circuit. In accordance with the present invention, the resonant circuit effectively is shunted by a resistance at the frequency of oscillation. In one aspect of the present invention, the resonant circuit includes a crystal in series with a tuning capacitor shunted by the two feedback voltage dividing capacitors in series. Input resistive and capacitive effects in the transistor vary with supply voltage. Oscillator frequency is reduced by an increase in supply voltage since the base-to-emitter or input capacity is increased. The shunt resistance across the resonant circuit effectively changes the degree of resistance change in the transistor due to supply voltage changes to oppose and substantially compensate for the simultaneous change in transistor capacitance with said voltage changes.

The invention will be described in greater detail by reference to the accompanying drawing in which.

Figures 1, 2, 3:
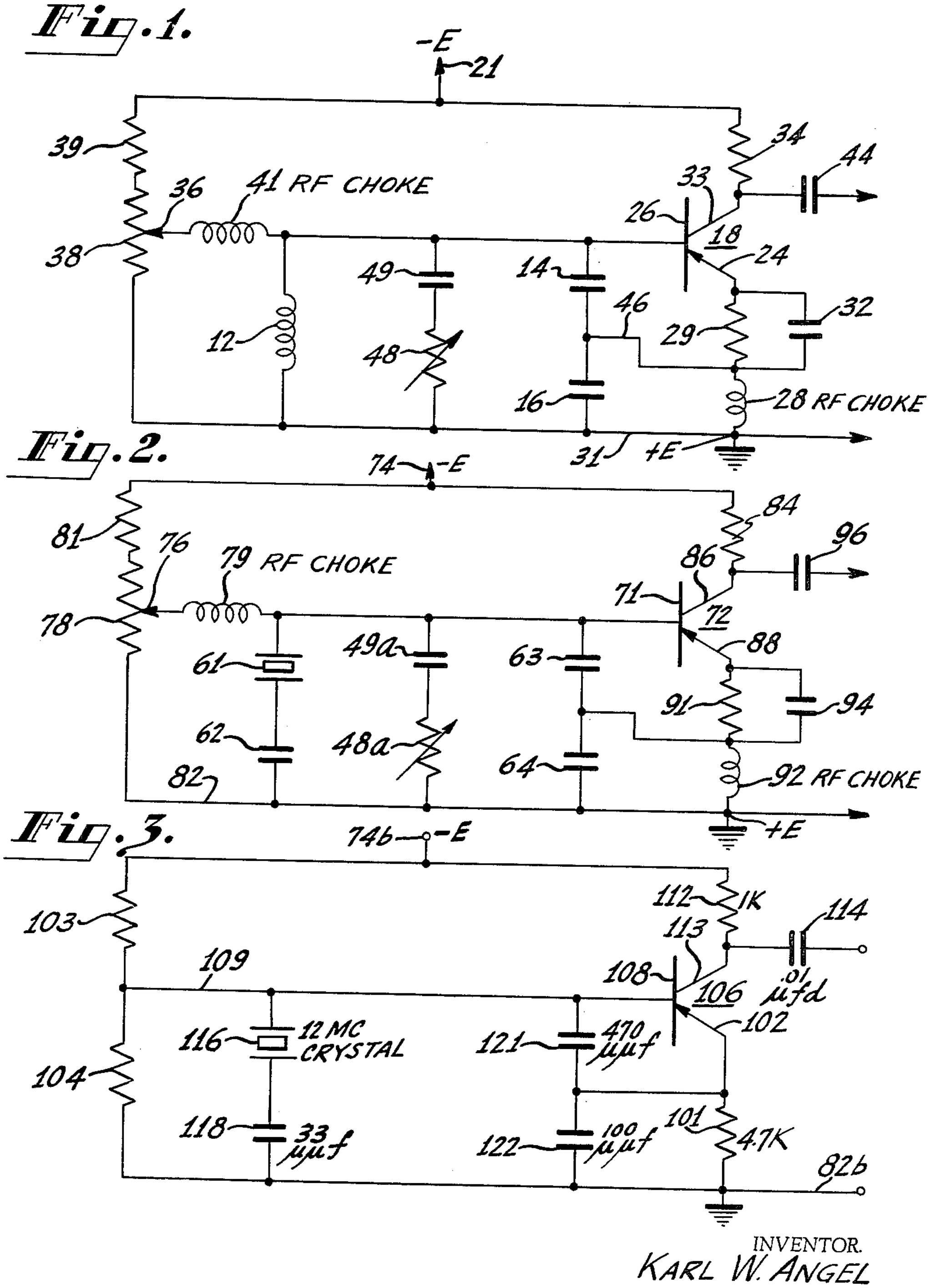
FIGURE 1 is a schematic circuit diagram of a transistor oscillator embodying the present invention.
FIGURE 2 is a schematic circuit diagram of a modification of the oscillator of FIGURE 1 in which a crystal is included in the frequency controlling resonant circuit.
FIGURE 3 is a schematic circuit diagram of a modification of the oscillator of FIGURE 2.

Referring to FIGURE 1 of the drawing, an oscillator of the Colpitts type embodying the present invention is shown in which the frequency determining resonant LC (inductance-capacity) circuit comprises an inductor 12 shunted by series connected capacitors 14 and 16. A transistor 18, shown illustratively as being a PNP junction transistor, is biased by a voltage applied to a terminal 21. It will be understood that a connection from the negative terminal of the bias source (not shown) is made to the terminal 21 and its positive terminal is connected to a voltage reference point in the oscillator such, for example, as ground. The emitter 24 of the transistor is biased in the forward direction with respect to the base 26 by a connection through an RF (radio frequency) choke 28, which provides RF isolation, and a resistor 29 to a grounded conductor 31. The resistor 29 is shunted by a bypass capacitor 32. The collector 33 of the transistor is biased in the reverse direction with respect to the base by a connection through a resistor 34 to the terminal 21. Bias supply for the base 26 is provided from the slider 36 of a potentiometer resistor 38 and resistor 39 connected in series between the terminal 21 and the conductor 31. The connection from the potentiometer slider 36 to the base 26 includes an RF choke 41 for RF isolation. Output from the oscillator may be taken by way of a coupling capacitor 44 from the collector 33.

In the oscillator of FIGURE 1, the total oscillatory voltage appears across the frequency determining LC circuit comprising the inductor 12 and the capacitors 14 and 16. This LC circuit is, in effect, connected between the base and collector of the transistor 18. The total oscillatory voltage path just mentioned includes the load resistor 34 and the supply voltage source which is returned to ground. The other side of the oscillatory circuit is shown as being grounded. However, this ground connection is not concerned in the internal functioning of the oscillator, but is a convenience for connection to other associated apparatus, for example, a modulator. Also, load resistor 34 can as well be made zero provided the desired output can be taken from another portion of the circuit, for example, from the base terminal. A portion of the total voltage appearing across the LC circuit is fed back by way of a conductor 46 to the emitter of the transistor. This feedback path is such that the emitter 24 may be regarded as the common electrode in the oscillator circuit, the output being taken across the collector load resistor 34 since, as pointed out above, the end of the resistor 34 is returned to the emitter by way of the voltage supply source.

A resistor 48 and a direct current blocking capacitor 49 are connected so that the resistor 48 provides a load on the LC circuit. In the oscillator circuit of FIGURE 1 employing, for example, a type 2N1177 transistor, without benefit of the resistor 48, as the base to ground voltage increases in the negative direction the base to emitter capacity increases. The input resistance, which is the base to emitter resistance, decreases. This increase in supply voltage causes an increase in drive as well as an increase in the base to emitter capacitance. This capacitance increase will reduce the frequency because of the increase in the LC product. Also, frequency is reduced because of the increase in phase lag of the inherent phase shift network of the transistor base. The phase shift network introducing the lag includes base to emitter capacitance and the input series base resistance. The input resistance reduction will conversely tend to increase the frequency. In the oscillator circuit of FIGURE 1, the effect of the change in base to emitter capacitance causing an increase in the LC product and the increase in lag of the inherent phase shift network of the base are opposed and balanced by the proper loading adjustment of resistor 48 and the input resistance change. Therefore, operation of the transistor oscillator at a level which gives changes in resistive and capacitive effects that are substantially exactly opposed will give substantially perfect compensation over wide ranges of supply variation.

FIGURE 2 of the drawing shows a modification of the oscillator of FIGURE 1 in which a crystal 61 in series with a tuning capacitor 62 is employed as the frequency controlling resonant circuit. The resonant circuit is shunted by voltage divider capacitors 63 and 64 in series. These capacitors have a value of capacitance much greater than the value of capacitor 62 making the frequency primarily dependent on the equivalent inductance and capacity of the crystal 61 and tuning capacitor 62 in series. Also, capacitor 63 is large with respect to transistor input capacitance changes. The junction of the series connected capacitors 63 and 64 provides a tap from which a portion of the total voltage is fed back to the emitter junction 88 of an oscillator transistor 72.

The base 71 is biased from a terminal 74 by way of the slider 76 of a potentiometer resistor 78 and an RF choke 79. The resistor 78 is connected in series with a resistor 81 between the terminal 74 and a conductor 82 which is connected to the positive terminal of a bias supply source (not shown). A resistor 84 serves as a load resistor for the collector 86. The emitter 88 of the transistor is biased in the forward direction with respect to the base 71 by way of a resistor 91 and an RF choke 92. The resistor 91 is shunted by a bypass capacitor 94. Oscillator output is taken from the collector by way of a coupling capacitor 96. When the resistor 48*a* is adjusted, there will be found a value for which the oscillator frequency has the least dependence on supply voltage, for any given setting of the potentiometer slider 76. Similarly, for any adjusted value of the resistor 48*a*, there will be found a setting of slider 76 for which the oscillator frequency depends least on the supply voltage. By adjusting both the potentiometer slider 76 and the resistor 48*a*, any desired level of oscillator output voltage can be produced for which wide variations in supply voltage have substantially no effect on frequency.

FIGURE 3 of the drawing shows an arrangement wherein the RF chokes 79 and 92, and resistor 91 and capacitor 94 are removed. The resistor 101 for the emitter 102 is used to provide emitter bias as well as RF isolation of the emitter terminal 102 from the grounded conductor 82*b*. In FIGURE 3 the function of the base supply potentiometer and the desired loading effect of the resistor 48*a* is served by the resistive divider made up of resistors 103 and 104 connected in series between the terminal 74*b* and the conductor 82*b*. As in FIGURE 2, the bias source (not shown) is connected between the terminal 74*b* and the conductor 82*b*. For the component values to be given by way of example for FIGURE 3, the terminal 74*b* is 20 volts negative with respect to the conductor 82*b* when, for example, a type 2N1177 transistor is employed as the transistor 106. The base 108 is connected directly to the junction of the resistors 103 and 104 by a conductor 109. A resistor 112 serves as the load resistor for the collector 113. The oscillator output is taken from the collector 113 by way of a coupling capacitor 114 and the conductor 82*b*.

The frequency controlling resonant circuit is made up of a crystal 116, a capacitor 118, a capacitor 121 and a capacitor 122. Capacitors 121 and 122, corresponding respectively to the capacitors 63 and 64 of FIGURE 2 provide a feedback connection to the emitter 102.

By way of example, the transistors shown on the drawing are type 2N1177. This is a "drift" transistor. Also, the oscillator of this invention is capable of operation in the high frequency range, for example, from 12 mc. (megacycles) to 14.5 mc. This oscillator with the parameters described remains within ±0.00002% of a center frequency for a ±15% supply voltage variation. This stability figure includes effects of variations of inexpensive drift transistors that are suitable for use in view of the requirement for power gain and saturation current. Variations due to a variety of crystals of high and low activity are also included in the stability figure.

By way of example, the capactiors of FIGURE 3 may have the following values:

| | Mfd. |
|---|---|
| Capacitor **114** | .01 |
| Capacitor **118** | 33 |
| Capacitor **121** | 470 |
| Capacitor **122** | 100 |

Also, and by way of example, the resistors may have the following values:

| | K ohms |
|---|---|
| Resistor **101** | 4.7 |
| Resistor **103** | 5.6 |
| Resistor **104** | 3.3 |
| Resistor **112** | 1.0 |

These values are given solely by way of example in connection with one embodiment in accordance with the present invention.

In general, the procedure for selecting suitable resistance compensation for reducing frequency variations due to supply voltage changes comprises the following steps:

(1) Without the compensating resistance, adjust the oscillator parameters in accordance with known techniques to provide the desired frequency and power output;

(2) Measure frequency deviation $\Delta f_1$ for a predetermined change in supply voltage;

(3) Insert a loading resistance $R_a$ and remeasure as in (2) to provide $\Delta f_2$;

(4) The desired value $R_d$ of loading resistance is then approximately:

$$R_d = R_a\left(\frac{\Delta f_1 - \Delta f_2}{\Delta f_1}\right);$$

(5) Successive interpolations, as above, may be desirable for more precise compensation.

The sign of $\Delta f_1$ may be initially chosen as positive for a given polarity direction of supply voltage change. Then the sign of $\Delta f_2$ should be taken as positive for the same direction of frequency change as $\Delta f_1$ and negative for an opposite direction of frequency change, for the same direction of supply voltage change as used for $\Delta f_1$.

What is claimed is:

An oscillator comprising a transistor having a base, collector and emitter electrodes, connection means for applying energizing potentials for said electrodes from an energizing potential source, a voltage divider resistor connected to said first named means whereby said voltage divider is connected across said source, means to apply an energizing potential to said base electrode from said voltage divider resistor, means to apply energizing potentials to said collector and emitter electrodes from opposite ends, respectively, of said voltage divider resistor, a frequency controlling resonant circuit comprising a crystal and a capacitor connnected in series between said base and that end of said voltage divider resistor coupled to said emitter electrode, regenerative feedback means comprising a pair of series-connected capacitors connected in shunt to said resonant circuit and a connection from the junction point of said series-connected capacitors to said emitter electrode, said transistor device being subject to variations in base-to-emitter capacitance and in input resistance with changes in said energizing potentials whereby said changes in said input resistance oppose said changes in said base-to-emitter capacitance and whereby the operating frequency of said oscillator changes when said base-to-emitter capacitance changes and said input resistance changes are not balanced, a stabilizing means including a resistive means and a D.C. blocking capacitor connected in series between said base and said end of said voltage divider resistor coupled to said emitter electrode, said resistive means having a resistive value causing said resistive means and said input resistance to oppose and balance the effect of said variations in said base-to-emitter capacitance for stabilizing the operating frequency of said oscillator.

References Cited by the Examiner

UNITED STATES PATENTS

| | | | |
|---|---|---|---|
| 2,894,208 | 7/1959 | Crow | 331—116 X |
| 2,915,708 | 12/1959 | Mohler | 331—116 X |

| | | | |
|---|---|---|---|
| 3,037,171 | 5/1962 | Cerofolini | 331—117 X |
| 3,041,550 | 6/1962 | Goncharoff | 331—164 X |

OTHER REFERENCES

Steele: 9 Mc. Crystal Standard Oscillator. In Military Standardization Handbook–215, pages 5–26, June 15, 1960.

ROY LAKE, *Primary Examiner.*

JOHN KOMINSKI, S. H. GRIMM, *Examiners.*